US007485521B2

(12) United States Patent
Zhu et al.

(10) Patent No.: US 7,485,521 B2
(45) Date of Patent: Feb. 3, 2009

(54) SELF-ALIGNED DUAL STRESSED LAYERS FOR NFET AND PFET

(75) Inventors: Huilong Zhu, Poughkeepsie, NY (US); Brian L. Tessier, Poughkeepsie, NY (US); Huicai Zhong, Wappingers Falls, NY (US)

(73) Assignees: International Business Machines Corporation, Armonk, NY (US); Advanced Micro Devices, Inc. (AMD), Sunnyvale, CA (US)

( * ) Notice: Subject to any disclaimer, the term of this patent is extended or adjusted under 35 U.S.C. 154(b) by 490 days.

(21) Appl. No.: 11/160,676

(22) Filed: Jul. 5, 2005

(65) Prior Publication Data

US 2007/0007552 A1    Jan. 11, 2007

(51) Int. Cl.
    *H01L 21/8238*  (2006.01)
(52) U.S. Cl. .................. 438/199; 438/153; 438/154; 438/218; 438/219; 438/275; 438/938; 257/E21.632; 257/E21.639; 257/E21.64
(58) Field of Classification Search ......... 438/199–233, 438/299, 585, 759, 761, 778, 153, 154, 188, 438/275, 735–738, 743, 744, 787–794, 938; 257/E21.598, E21.63–E21.644
See application file for complete search history.

(56) References Cited

U.S. PATENT DOCUMENTS

| 7,214,629 | B1 * | 5/2007 | Luo et al. ................. 438/778 |
| 7,288,451 | B2 * | 10/2007 | Zhu et al. ................. 438/228 |
| 2005/0214998 | A1 * | 9/2005 | Chen et al. ................ 438/199 |
| 2006/0091471 | A1 * | 5/2006 | Frohberg et al. ........... 257/369 |
| 2006/0228836 | A1 * | 10/2006 | Yang et al. ................ 438/149 |
| 2006/0228848 | A1 * | 10/2006 | Chan et al. ................ 438/199 |
| 2007/0122982 | A1 * | 5/2007 | Chan et al. ................ 438/275 |
| 2007/0296044 | A1 * | 12/2007 | Chidambarrao et al. ..... 257/382 |

* cited by examiner

*Primary Examiner*—Zandra Smith
*Assistant Examiner*—Joseph C Nicely
(74) *Attorney, Agent, or Firm*—Todd M C Li; Hoffman Warnick LLC

(57) ABSTRACT

Methods are disclosed for forming self-aligned dual stressed layers for enhancing the performance of NFETs and PFETs. In one embodiment, a sacrificial layer is used to remove a previously deposited stressed layer. A mask position used to pattern the sacrificial layer is adjusted such that removal of the latter deposited stressed layer, using the sacrificial layer, leaves the dual stress layers in an aligned form. The methods result in dual stressed layers that do not overlap or underlap, thus avoiding processing problems created by those issues. A semiconductor device including the aligned dual stressed layers is also disclosed.

19 Claims, 11 Drawing Sheets

SELF-ALIGNED DUAL STRESSED LAYERS FOR NFET AND PFET

BACKGROUND OF THE INVENTION

1. Technical Field

The present invention relates generally to semiconductor fabrication and more particularly to self-aligned dual stressed layers for enhancing both n-type and p-type field effect transistors.

2. Related Art

The application of stresses to field effect transistors (FETs) is known to improve their performance. When applied in a longitudinal direction (i.e., in the direction of current flow), tensile stress is known to enhance electron mobility (or n-channel FET (NFET) drive currents) while compressive stress is known to enhance hole mobility (or p-channel FET (PFET) drive currents). One way to apply such stresses to a FET is the use of intrinsically-stressed barrier silicon nitride layers. For example, a tensile-stressed silicon nitride layer may be used to cause tension in an NFET channel while a compressively-stressed silicon nitride layer may be used to cause compression in a PFET channel. Accordingly, a dual stressed barrier layer is necessary to induce the desired stresses in an adjacent NFET and PFET.

In the formation of a dual barrier silicon nitride layers for stress enhancement of NFET/PFET devices, the first deposited layer is deposited and then is removed over the appropriate FET region by patterning and etching. The second layer is then deposited and then removed over the other of the two FET regions by patterning and etching. Due to misalignment of lithography and etching, either overlap or underlap may occur in the place where tensile and compressive layers meet after etching the second layer. The overlap and underlap can appear on/above the surface of underlying silicide. In particular, in cases where the layers do not meet (i.e., underlap), exposure of underlying materials can be problematic. For example, overetching of the underlying material typically results where underlap is present. In another example, where the underlying material is silicide, both overetching and oxidization of the silicide become issues. Alternatively, where the layers overlap, the increased thickness creates other problems. For example, etching via openings through the dual layer takes longer than in other locations where only one of the layers is present. As a result, over etching of areas where the overlap does not occur result in, for example, an increasing of the resistance of the silicide (or even a broken silicide line if the over etched area is on the top of gate conductor) or increasing junction leakage due to over-etching into the junction area in device source/drain and extension regions. Accordingly, one challenge relative to using compressive and tensile layers is achieving an alignment between the layers where they meet.

In view of the foregoing, there is a need in the art for self-aligned dual stressed layers.

SUMMARY OF THE INVENTION

The invention includes methods for forming self-aligned dual stressed layers for enhancing the performance of NFETs and PFETs. In one embodiment, a sacrificial layer is used to remove a later deposited stressed layer. A mask position used to pattern the sacrificial layer is adjusted such that removal of the latter deposited stressed layer, using the sacrificial layer, leaves the dual stress layers in an aligned form. The methods result in dual stressed layers that do not overlap or underlap, thus avoiding processing problems created by those issues. A semiconductor device including the aligned dual stressed layers is also disclosed.

A first aspect of the invention is directed to a method for forming a self-aligned dual stressed layer for a semiconductor device having an NFET and a PFET, the method comprising the steps of: forming a first stressed silicon nitride layer over a first one of the NFET and the PFET, the first stressed silicon nitride layer including an end over a portion of an intermediate region between the NFET and the PFET; depositing a second stressed silicon nitride layer over the NFET, the PFET and the intermediate region, the second stressed silicon nitride layer forming a first shoulder over the end of the first stressed silicon nitride layer; forming a sacrificial layer over the second stressed silicon nitride layer, the sacrificial layer forming a second shoulder over the first shoulder; forming a mask over the sacrificial layer and a second one of the NFET and the PFET such that a mask edge is between the first shoulder and the second shoulder; removing the sacrificial layer over the first one of the NFET and the PFET using the mask; removing the mask; and removing the second stressed silicon nitride layer over the first one of the NFET and the PFET.

A second aspect of the invention includes a method for self-aligning stressed layers for a semiconductor device having an NFET and a PFET, the method comprising the steps of: forming a first stressed layer over a first one of the NFET and PFET; depositing a second stressed layer over the NFET and the PFET, the second stressed layer having a first shoulder where the second stressed layer extends over an end of the first stressed layer; forming a sacrificial layer over the second stressed layer, the sacrificial layer having a second shoulder where the sacrificial layer extends over the first shoulder; forming a mask over a second one of the NFET and the PFET such that a mask edge is one of over the second shoulder and nearly aligned with the first shoulder; removing the sacrificial layer over the first one of the NFET and the PFET using the mask; removing the mask; and removing the second stressed layer over the first one of the NFET and the PFET.

A third aspect of the invention related to a semiconductor device comprising: an NFET and a PFET; a tensile silicon nitride layer over the NFET; and a compressive silicon nitride layer over the PFET, wherein an edge of the tensile silicon nitride layer is substantially aligned with an edge of the compressive silicon nitride layer.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

With reference to the accompanying drawings, FIGS. 1-11 show steps of a method for forming self-aligned dual stressed layers for a semiconductor device having an NFET and a PFET according to various embodiments of the invention. In the following description, each stressed layer will be described as a silicon nitride ($Si_3N_4$) layer. However, it should be recognized that the teachings of the invention may be employed with any now known or later developed materials for applying a stress in a semiconductor device.

Figure 1:
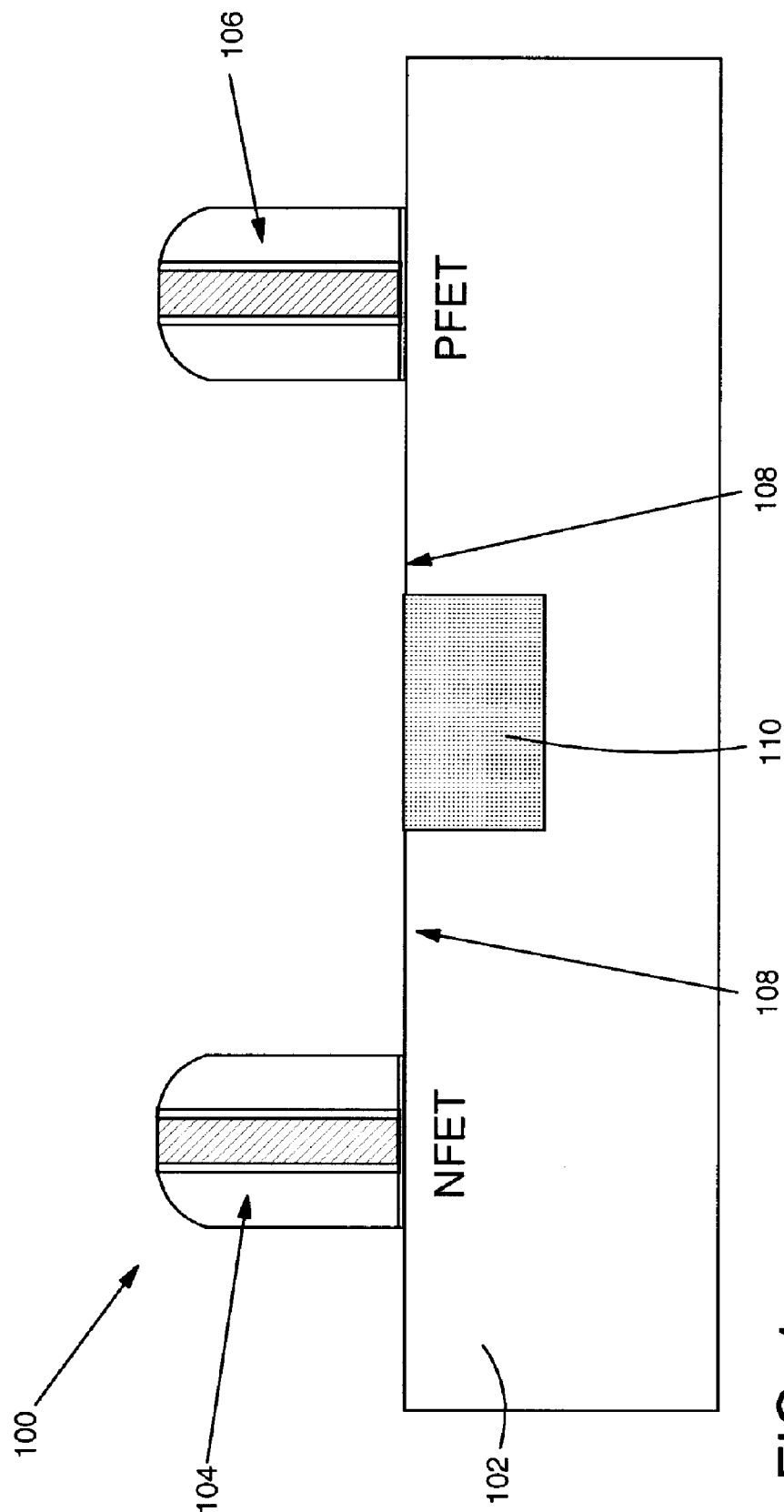
FIGS. 1-11 show steps of a method for forming self-aligned dual stressed layers according to various embodiments of the invention.

Referring to FIG. 1, processing begins with a pre-formed structure 100 including a silicon substrate 102 including an n-type field effect transistor (NFET) 104 (including silicide in the source/drain region (not shown) and top part of gate) and a p-type field effect transistor (PFET) 106 (including silicide in the source/drain region (not shown) and top part of gate) formed thereon. NFET 104 and PFET 106 are separated by an intermediate region 108 including a trench isolation 110, e.g., a shallow trench isolation (STI). Each FET includes conventional structures such as a gate oxide, a polysilicon gate, silicon nitride spacer and appropriate dopant(s).

Figure 2:
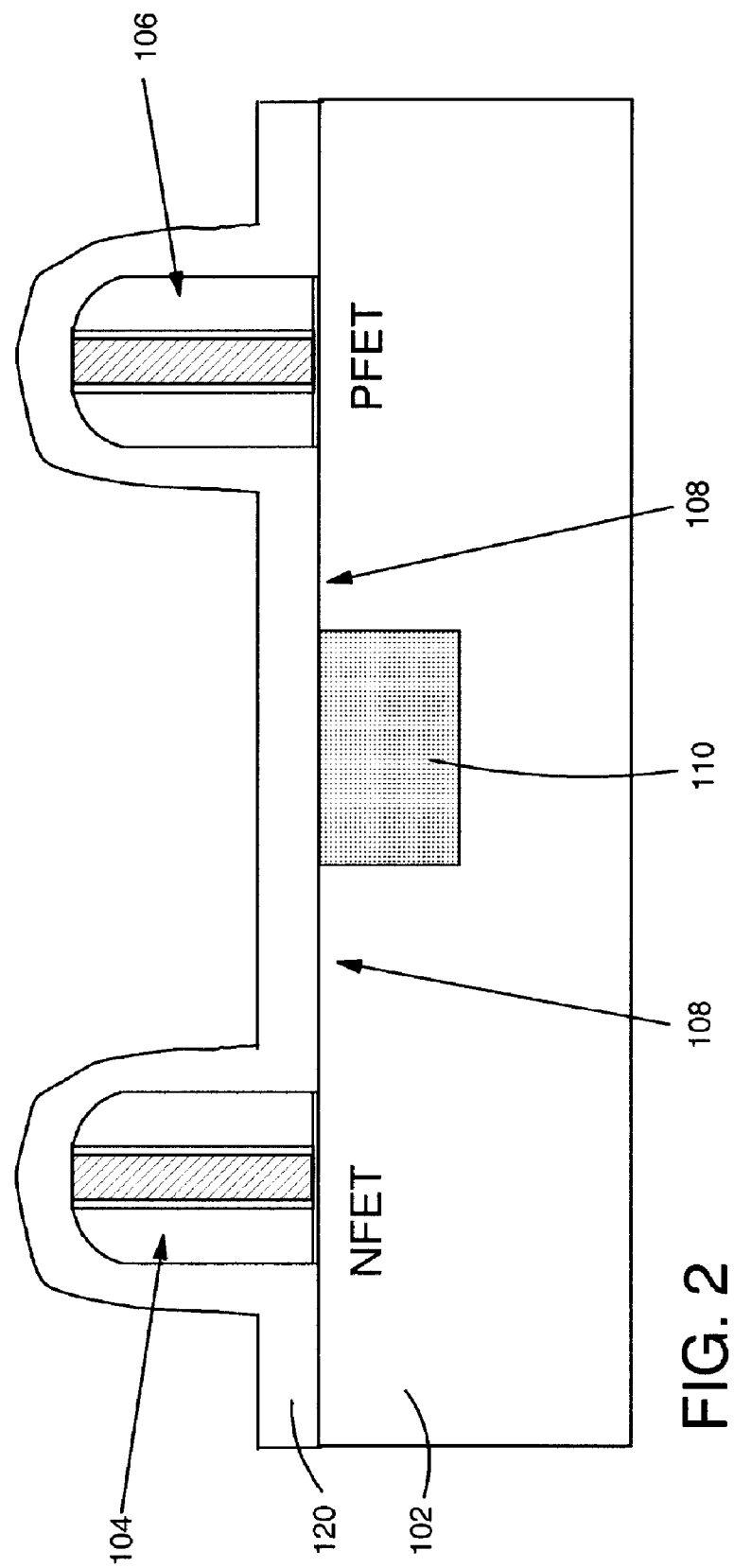
Figure 3:
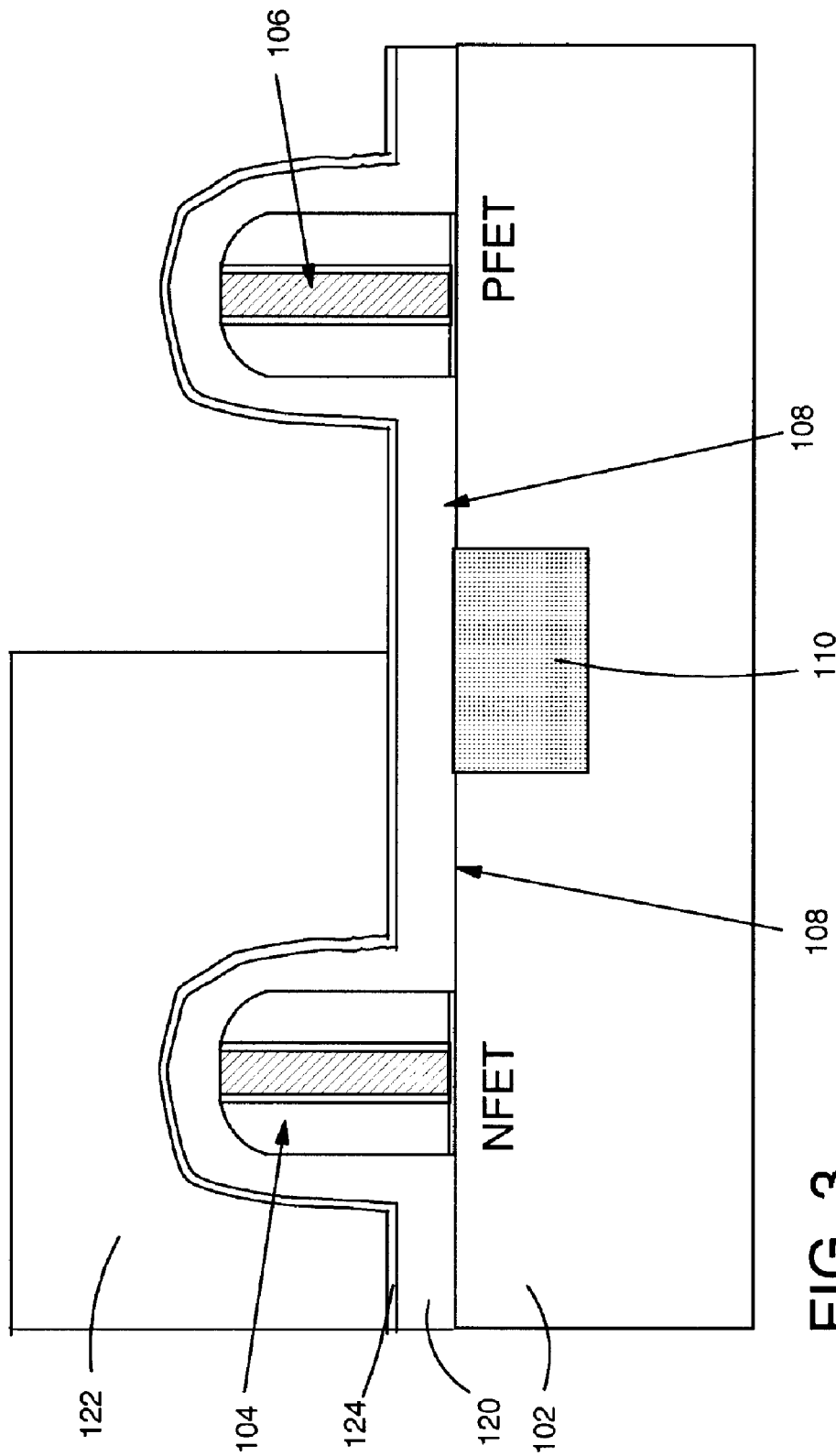
Figure 4:
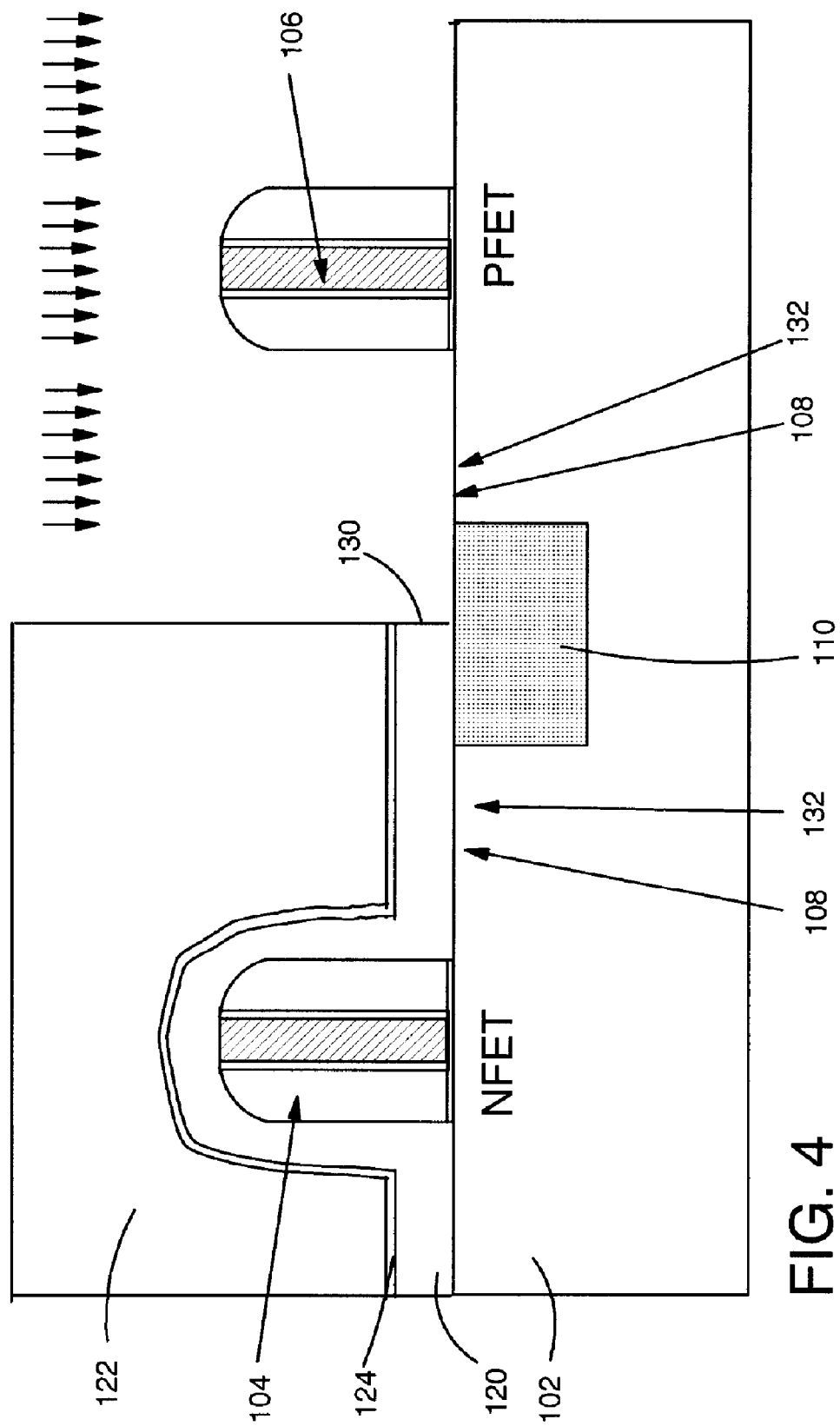

FIGS. 2-4 show a step of forming a first stressed silicon nitride layer 120 (hereinafter "first stressed layer 120") over a first one of NFET 104 and PFET 106, i.e., not both. In one embodiment, the 'first one' includes NFET 104 and a 'second one' includes PFET 106. Accordingly, first stressed layer 120 includes a tensile silicon nitride, which enhances performance of NFET 104, and a second stressed silicon nitride layer, to be described below, includes a compressive silicon nitride, which enhances PFET 106. It should be recognized, however, that the order in which the stressed layers are formed can be reversed. That is, a compressive silicon nitride layer may be formed first over PFET 106.

As shown in FIG. 2, a first sub-step may include depositing first stressed layer 120 over NFET 104, PFET 106 and intermediate region 110. Deposition can be by any now known or later developed technique such as chemical vapor deposition (CVD). First stressed layer 120 may have a thickness of, for example, approximately 50 nm to approximately 100 nm. FIG. 3 shows a second sub-step of forming a mask 122, i.e., photoresist, over first stressed layer 120 such that a second one of NFET 104 and PFET 106 is exposed. In the illustrated embodiment, PFET 106 is exposed. Mask 122 can be formed in any now known or later developed fashion, and may include any conventional mask material. In addition, FIG. 3 shows an optional step of depositing an etch stop layer 124 over first stressed layer 120 prior to forming mask 122. Deposition can be by any now known or later developed technique such as chemical vapor deposition (CVD). Etch stop layer 124 may include, for example, any conventional etch stop material such as silicon dioxide ($SiO_2$). FIG. 4 shows another sub-step including removing first stressed layer 120 from over the second one of NFET 104 and PFET 106, i.e., as shown PFET 106. The removal step may include any now known or later developed technique, e.g., reactive ion etch (RIE) of etch stop layer 124 (when provided) and first stressed layer 120. As shown in FIG. 4, first stressed layer 120 terminates in an end 130 over a portion of intermediate region 108 between NFET 104 and PFET 106. While end 130 is shown positioned over trench isolation 110, it should be recognized that it could also be formed over silicide regions 132 on either side of STI 110 and/or on/above the top of gate silicide in a real IC layout.

Figure 5:
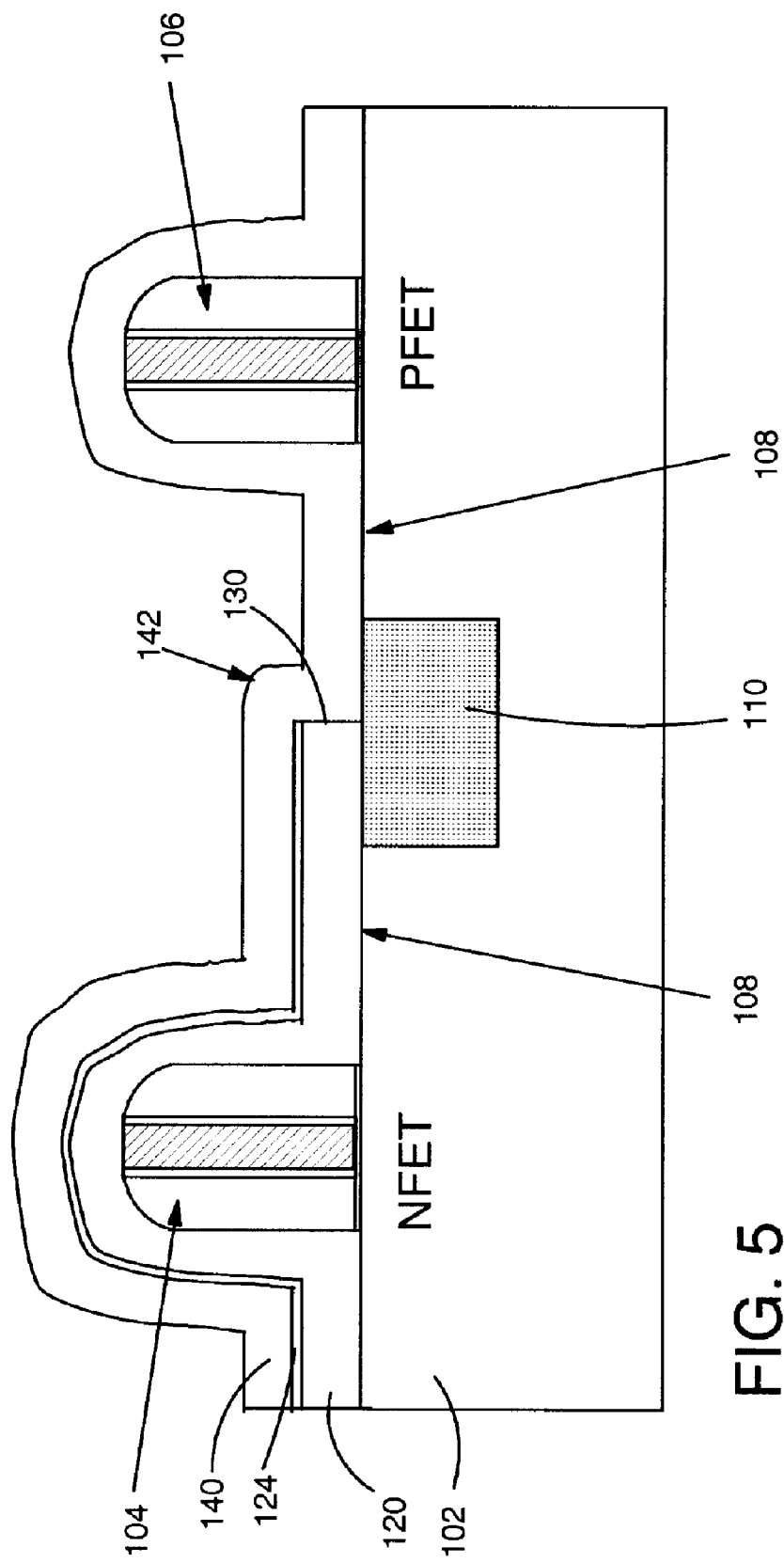

Turning to FIG. 5, a next step includes depositing a second stressed silicon nitride layer 140 (hereinafter "second stressed layer") over NFET 104, PFET 106 and intermediate region 108. Deposition can be by any now known or later developed technique such as chemical vapor deposition (CVD). As shown, second stressed layer 140 forms a first shoulder 142 over end 130 of first stressed layer 120.

Figure 6:
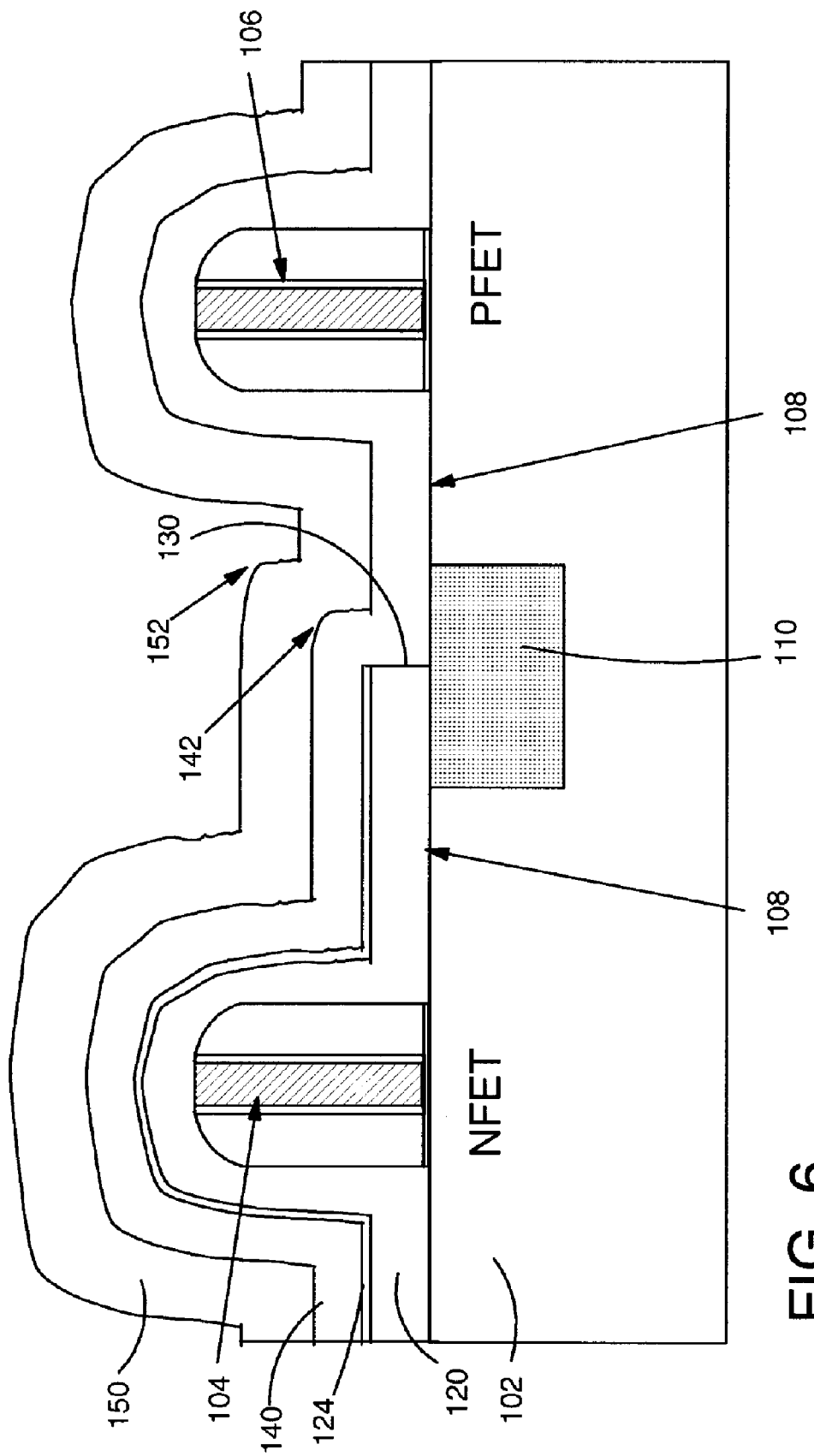

FIG. 6 shows forming a sacrificial layer 150 over second stressed layer 140. This step includes sacrificial layer 150 forming a second shoulder 152 over first shoulder 142, i.e., not directly over but offset where sacrificial layer 150 extends over first shoulder 142. In one embodiment, sacrificial layer 150 includes silicon dioxide ($SiO_2$). Sacrificial layer 150 may have a thickness, for example, of no less than approximately 70 nm to no greater than approximately 100 nm.

Figure 7:
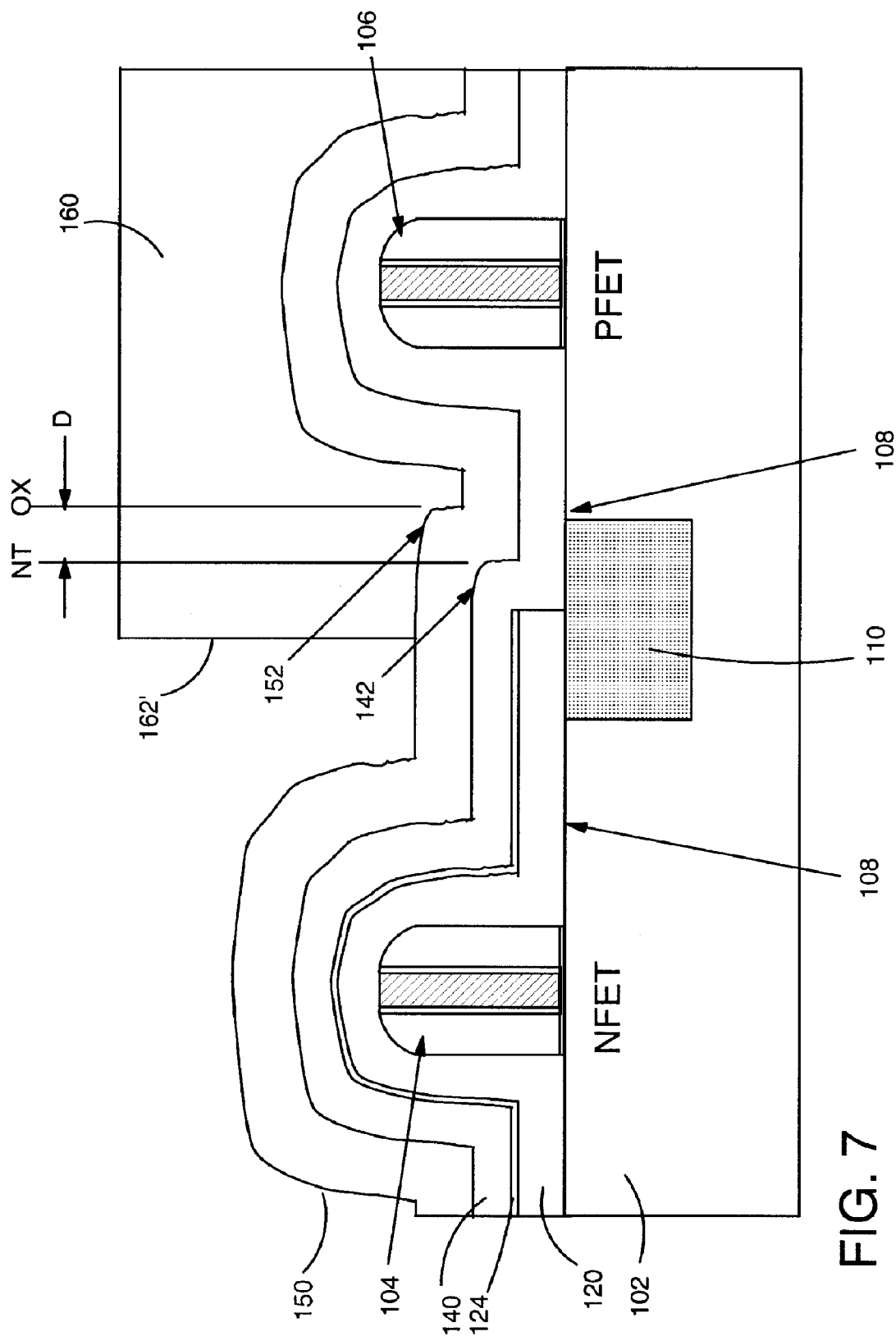
Figure 8:
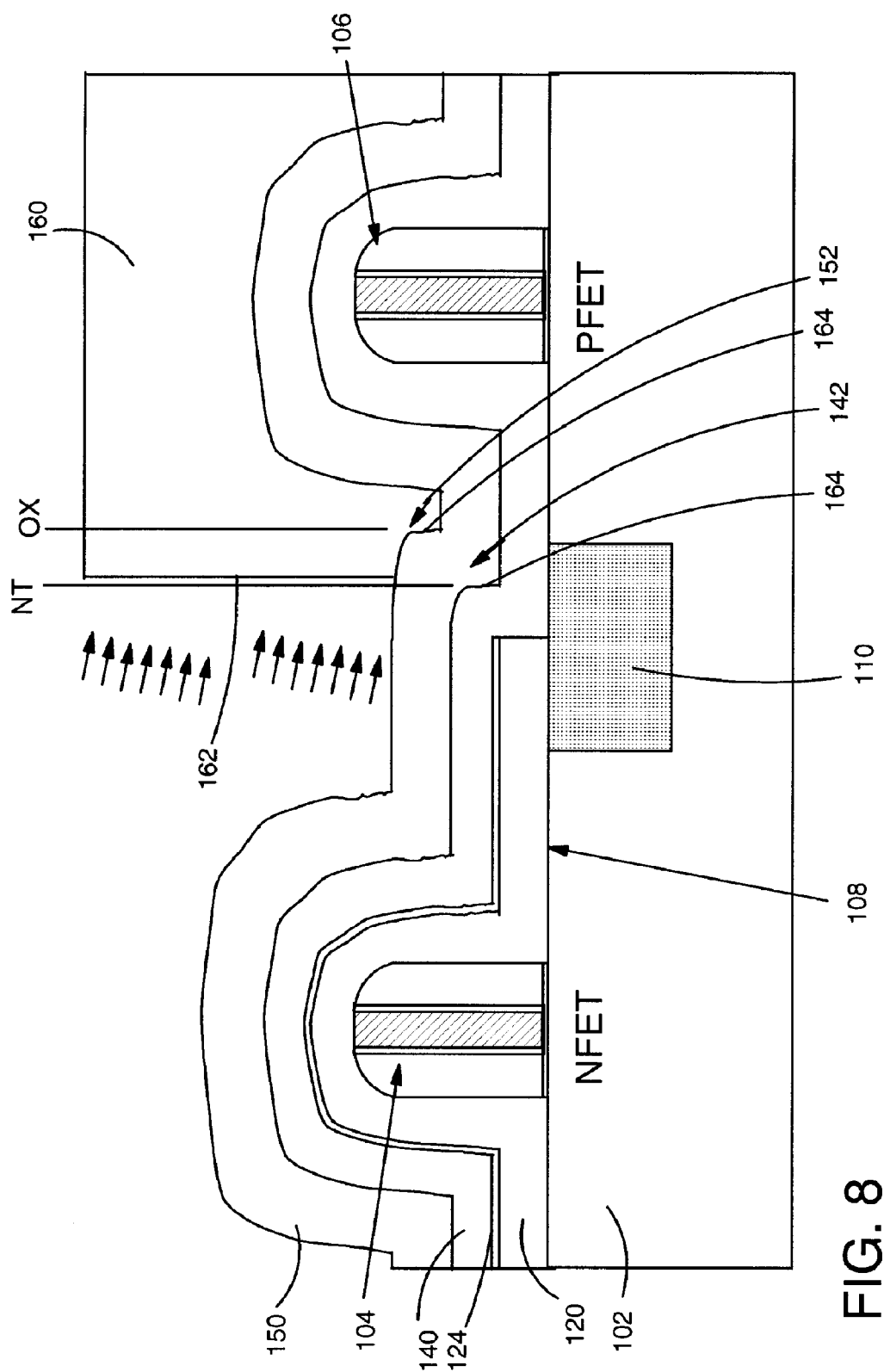

FIGS. 7-8 show forming a mask 160 over sacrificial layer 150 and a second one of NFET 104 and PFET 106 such that a mask edge 162 (FIG. 8) is between first shoulder 142 and second shoulder 152 as defined by a sidewall 164 of the particular shoulder in issue. In one embodiment, mask edge 162 is either nearly aligned with first shoulder 142, shown via indicator line NT, or over second shoulder 152, i.e., between indicator lines NT and OX in FIG. 7, of sacrificial layer 150. As used herein, "mask edge" means at least the point of mask 160 at which the mask interfaces with sacrificial layer 150. Further, "aligns" means substantially lining up with a sidewall 164 of the particular shoulder in issue. In one embodiment, this step includes forming mask 160 over sacrificial layer 150 such that a mask edge 162' (FIG. 7) is distanced from first shoulder 142, and etching (FIG. 8) to move mask edge 162 (FIG. 8) closer to first shoulder 142. In any event, mask edge 162 is adjusted such that mask 160 does not pass second shoulder 152, i.e., it does not pass indicator line OX and second shoulder 152 remains covered. As will be observed later, the distance D (FIG. 7) between first shoulder 142 (indicator line NT) and second shoulder 152 (indicator line OX) (i.e., |position-NT-position-OX|), determines the tolerance for the process for misalignment due to lithography and etching.

Figure 9:
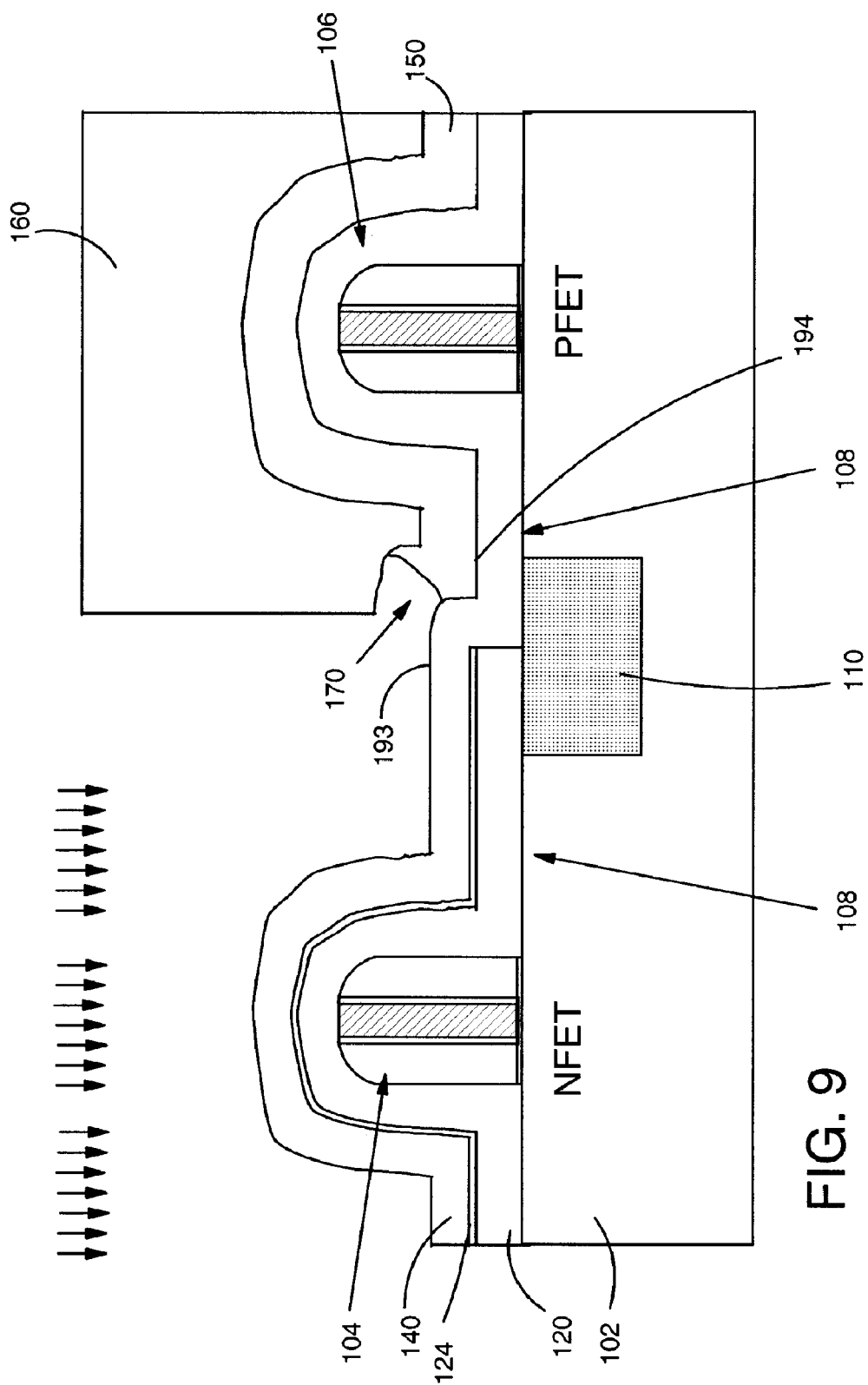

FIG. 9 shows removing sacrificial layer 150 over the first one of NFET 104 and PFET 106 using mask 160, i.e., NFET 104 as shown. As this occurs, second shoulder 152 of sacrificial layer 150 is at least partially removed such that mask 160 is undercut at point 170. In one embodiment, this step includes isotropically dry etching sacrificial layer 150, stopping on second stressed layer 140. In another embodiment, when mask edge 162 lands between indicator lines NT and OX (FIG. 8), an anisotropical etch can be used to remove sacrificial layer 150 stopping between surfaces 193 and 194 of second stressed layer 140.

Figure 10:
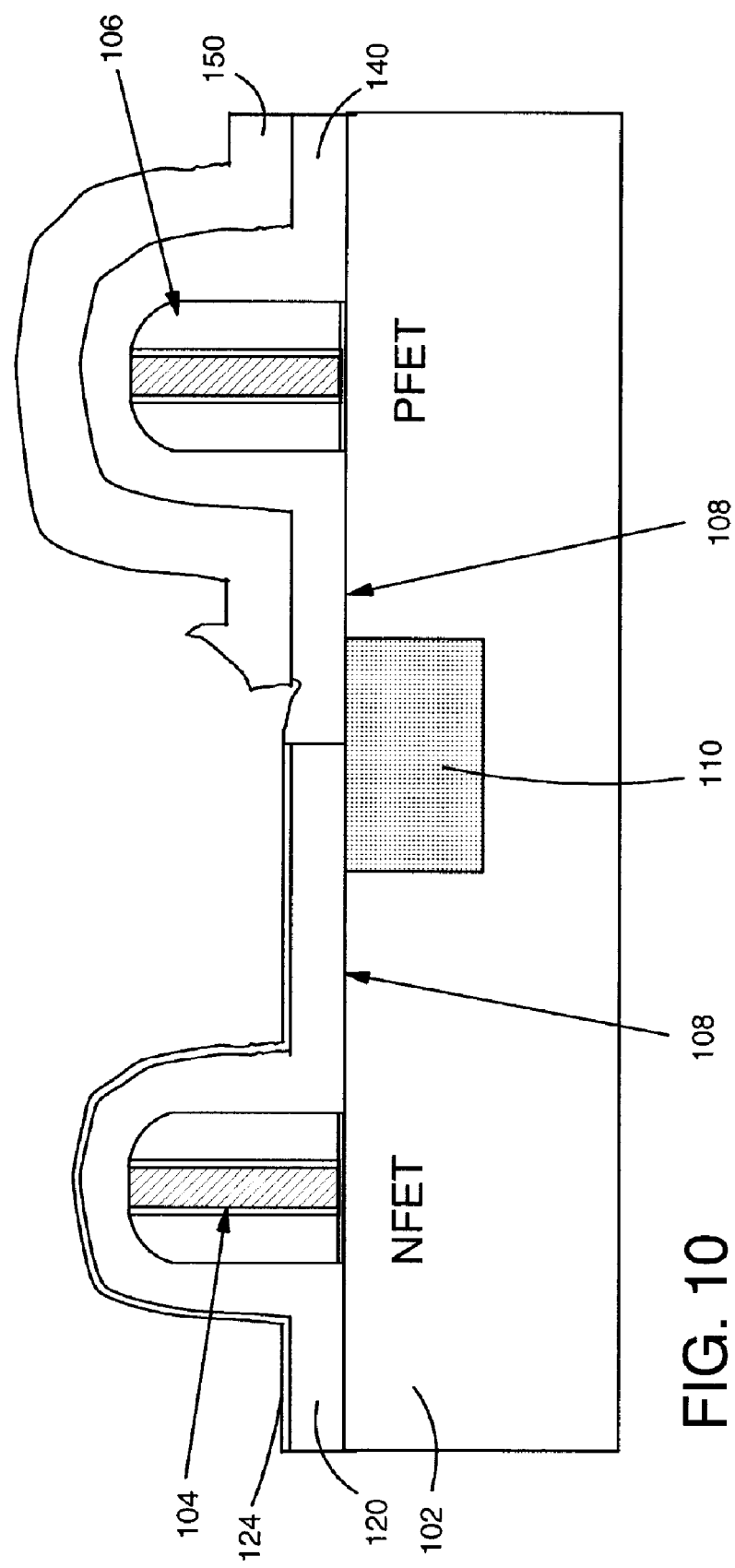

Turning to FIG. 10, mask 160 is removed. In addition, second stressed layer 140 is removed over the first one of NFET 104 and the PFET, i.e., NFET 104 as shown. Each removal step may include, for example, any now known or later developed etching technique for the particular material being removed. For example, second stressed layer 140 may be removed using an isotropic dry etch to first stressed layer 120 or, as shown, etch stop layer 124 (where provided).

Figure 11:
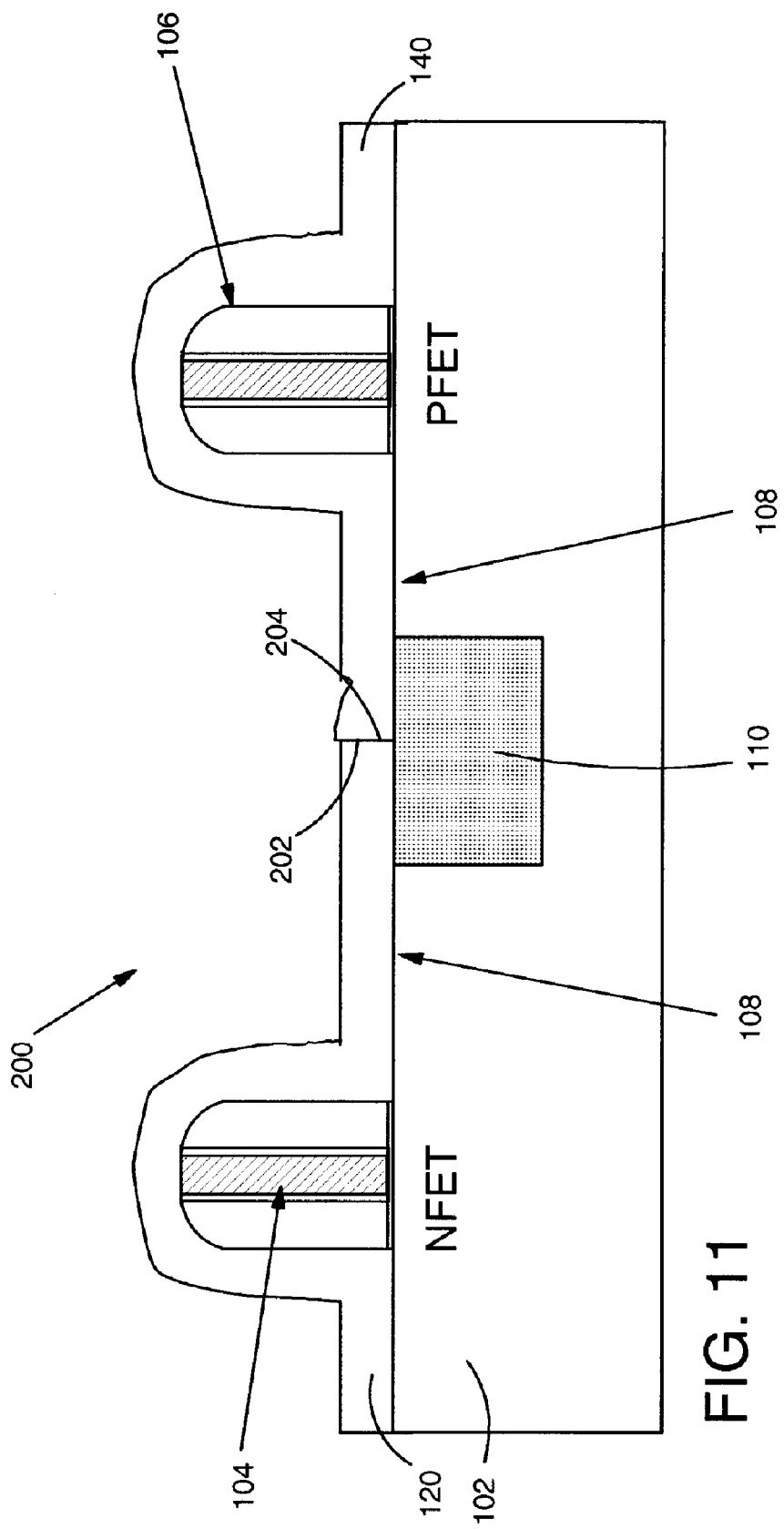

FIG. 11 shows another step of removing sacrificial layer 150 (FIG. 10) over the second one of NFET 104 and PFET 106, i.e., PFET 106 as shown. In addition, etch stop layer 124 (where provided) may be removed over NFET 104. The resulting semiconductor device 200 includes NFET 104 and PFET 106 and appropriate performance enhancing dual stressed layers 120, 140, i.e., a tensile stressed layer 120 over NFET 104 and a compressive stressed layer 140 over PFET 106. In addition, semiconductor device 200 includes an edge 202 of tensile stressed layer 120 that is substantially aligned with an edge 204 of compressive stressed layer 140. That is, the dual stressed layers 120, 140 are aligned with no overlap or underlap. As a result, subsequent processing does not have to address the issues that an overlap or an underlap would cause.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method for forming a self-aligned dual stressed layer for a semiconductor device having an NFET and a PFET, the method comprising the steps of:
   forming a first stressed silicon nitride layer over a first one of the NFET and the PFET, the first stressed silicon nitride layer including an end over a portion of an intermediate region between the NFET and the PFET;
   depositing a second stressed silicon nitride layer over the NFET, the PFET and the intermediate region, the second stressed silicon nitride layer forming a first shoulder over the end of the first stressed silicon nitride layer;
   forming a sacrificial layer over the second stressed silicon nitride layer, the sacrificial layer forming a second shoulder over the first shoulder;
   forming a mask over the sacrificial layer and a second one of the NFET and the PFET such that a mask edge is between the first shoulder and the second shoulder;
   removing the sacrificial layer over the first one of the NFET and the PFET using the mask;
   removing the mask; and
   removing the second stressed silicon nitride layer over the first one of the NFET and the PFET.

2. The method of claim 1, wherein the sacrificial layer forming step includes forming a second shoulder over the first shoulder, and
   wherein the mask forming step includes forming the mask such that the mask covers the second shoulder.

3. The method of claim 1, wherein the first stressed silicon nitride layer forming step includes:
   depositing the first stressed silicon nitride layer over the NFET, the PFET and the intermediate region;
   forming a mask over the first stressed silicon nitride layer such that a second one of the NFET and PFET is exposed; and
   removing the first stressed silicon nitride layer from over the second one of the NFET and the PFET.

4. The method of claim 1, wherein the sacrificial layer has a thickness of no less than approximately 70 nm and no greater than approximately 100 nm.

5. The method of claim 1, wherein the mask forming step includes:
   forming the mask over the sacrificial layer such that the mask edge is distanced from the first shoulder; and
   etching to move the mask edge closer to the first shoulder.

6. The method of claim 1, further comprising removing the sacrificial layer over the second one of the NFET and the PFET.

7. The method of claim 1, further comprising the step of depositing an etch stop layer over the first stressed silicon nitride layer.

8. The method of claim 1, wherein the first one is the NFET and the first stressed silicon nitride layer is a tensile silicon nitride, and the second one is the PFET and the second stressed silicon nitride layer is a compressive silicon nitride.

9. The method of claim 1, wherein the end is positioned over a trench isolation.

10. The method of claim 1, wherein the sacrificial layer includes silicon dioxide.

11. A method for self-aligning stressed layers for a semiconductor device having an NFET and a PFET, the method comprising the steps of:
    forming a first stressed layer over a first one of the NFET and PFET;
    depositing a second stressed layer over the NFET and the PFET, the second stressed layer having a first shoulder where the second stressed layer extends over an end of the first stressed layer;
    forming a sacrificial layer over the second stressed layer, the sacrificial layer having a second shoulder where the sacrificial layer extends over the first shoulder;
    forming a mask over a second one of the NFET and the PFET such that a mask edge is one of over the second shoulder and nearly aligned with the first shoulder;
    removing the sacrificial layer over the first one of the NFET and the PFET using the mask;
    removing the mask; and
    removing the second stressed layer over the first one of the NFET and the PFET.

12. The method of claim 11, wherein the sacrificial layer forming step includes forming a second shoulder over the first shoulder, and
    wherein the mask forming step includes forming the mask edge such that the mask edge covers the second shoulder.

13. The method of claim 11, wherein the first stressed layer forming step includes:
    depositing the first stressed layer over the NFET, the PFET and the intermediate region;
    forming a mask over the first stressed layer such that the second one of the NFET and PFET is exposed; and
    removing the first stressed layer from over the second one of the NFET and the PFET.

14. The method of claim 11, wherein the sacrificial layer has a thickness of no less than approximately 70 nm and no greater than approximately 100 nm.

15. The method of claim 11, wherein the mask forming step includes:
    forming the mask over the sacrificial layer such that the mask edge is distanced from the first shoulder; and
    etching to move the mask edge closer to the first shoulder.

16. The method of claim 11, further comprising removing the sacrificial layer over the second one of the NFET and the PFET.

17. The method of claim 11, further comprising the step of depositing an etch stop layer over the flit stressed layer.

18. The method of claim 11, wherein the intermediate region is positioned over a trench isolation.

19. The method of claim 11, wherein the fist and second stressed layers include silicon nitride.

* * * * *